US011092628B2

(12) United States Patent
Lee

(10) Patent No.: US 11,092,628 B2
(45) Date of Patent: Aug. 17, 2021

(54) POWER USAGE PREDICTION SYSTEM AND METHOD

(71) Applicant: DOOSAN HEAVY INDUSTRIES & CONSTRUCTION CO., LTD., Changwon-si (KR)

(72) Inventor: Yong Hee Lee, Yongin-si (KR)

( * ) Notice: Subject to any disclaimer, the term of this patent is extended or adjusted under 35 U.S.C. 154(b) by 487 days.

(21) Appl. No.: 16/148,108

(22) Filed: Oct. 1, 2018

(65) Prior Publication Data

US 2019/0187193 A1 Jun. 20, 2019

(30) Foreign Application Priority Data

Dec. 18, 2017 (KR) .................... 10-2017-0174257

(51) Int. Cl.
| | |
|---|---|
| *G01R 21/133* | (2006.01) |
| *G06Q 50/06* | (2012.01) |
| *H02J 3/00* | (2006.01) |
| *H02J 3/14* | (2006.01) |
| *H02J 3/32* | (2006.01) |

(52) U.S. Cl.
CPC .......... *G01R 21/133* (2013.01); *G06Q 50/06* (2013.01); *H02J 3/00* (2013.01); *H02J 3/003* (2020.01); *H02J 3/14* (2013.01); *H02J 3/32* (2013.01)

(58) Field of Classification Search
CPC ......... G01R 21/133; G06Q 50/06; H02J 3/00; H02J 3/003; H02J 3/14; H02J 3/32
See application file for complete search history.

(56) References Cited

U.S. PATENT DOCUMENTS 9,366,704 B2 * 6/2016 Haghighat-Kashani ..................... H02J 13/00002
9,483,306 B2 * 11/2016 Tajima ..................... H02J 3/14
(Continued)

FOREIGN PATENT DOCUMENTS

| JP | 2011-118786 A | 6/2011 |
|---|---|---|
| JP | 2013-207917 A | 10/2013 |

(Continued)

OTHER PUBLICATIONS

An European Search Report dated Mar. 4, 2019 in connection with European Patent Application No. 18205656.4 which corresponds to the above-referenced U.S. application.
(Continued)

*Primary Examiner* — Raymond L Nimox
(74) *Attorney, Agent, or Firm* — Harvest IP Law, LLP

(57) ABSTRACT

A power usage prediction system and method determines whether or not a predicted power usage exceeds a limit value using modeling data for power usage. The system includes a power measurement unit for measuring power usage at a certain time interval; a modeling unit for generating a plurality of data sets by grouping a certain number of a plurality of measurement data indicating the measured power usage in time series, storing the last measurement data of the data set as a modeling output, and storing measurement data other than the modeling output of the data set as a modeling input; and a prediction unit for inputting real-time data measured in real time in the power measurement unit into the modeling unit in time series, and predicting the power usage after the real-time data by corresponding the real-time data with the plurality of data sets.

16 Claims, 5 Drawing Sheets

(56) References Cited

U.S. PATENT DOCUMENTS

| | | | |
|---|---|---|---|
| 10,041,475 B1* | 8/2018 | Badrinath Krishna | ... F03D 9/25 |
| 10,873,209 B2* | 12/2020 | Li | ............................ G06N 3/02 |
| 2010/0025483 A1* | 2/2010 | Hoeynck | .................. H02J 3/14 |
| | | | 236/1 C |
| 2012/0158631 A1* | 6/2012 | Pitcher | .................... G06F 30/20 |
| | | | 706/21 |
| 2015/0371151 A1* | 12/2015 | Georgescu | ............. G06N 20/00 |
| | | | 706/12 |
| 2017/0317528 A1* | 11/2017 | Fife | ........................... H02J 3/00 |
| 2018/0223814 A1* | 8/2018 | Badrinath Krishna | ...................... |
| | | | G06N 3/084 |
| 2019/0101908 A1* | 4/2019 | Park | ....................... G08B 21/18 |
| 2019/0115753 A1* | 4/2019 | Sheehan | ................... H02J 3/00 |

FOREIGN PATENT DOCUMENTS

| | | |
|---|---|---|
| JP | 2015-047041 A | 3/2015 |
| JP | 2017-153259 A | 8/2017 |
| KR | 10-1364495 B1 | 2/2014 |

OTHER PUBLICATIONS

A Japanese Office Action dated Sep. 17, 2019 in connection with Japanese Patent Application No. 2018-155831 which corresponds to the above-referenced U.S. application.

A Korean Office Action dated Feb. 12, 2019 in connection with Korean Patent Application No. 10-2017-0174257 which corresponds to the above-referenced U.S. application.

* cited by examiner

[FIG. 1]
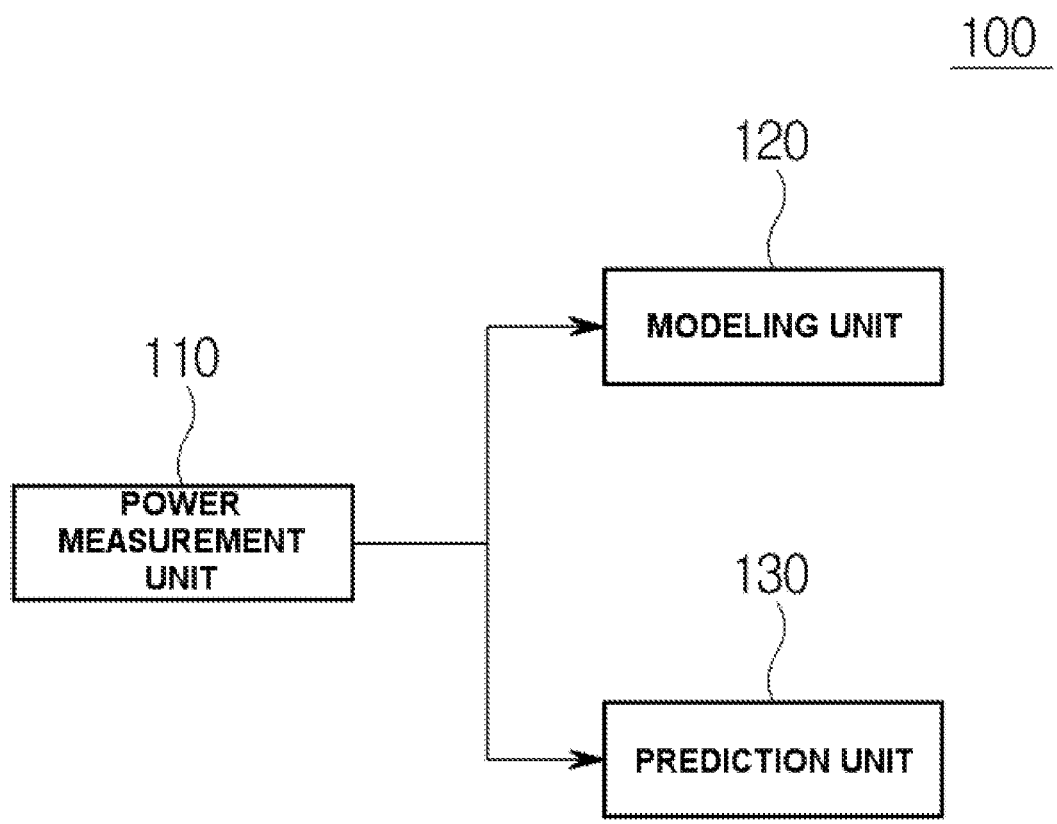

[FIG. 2]
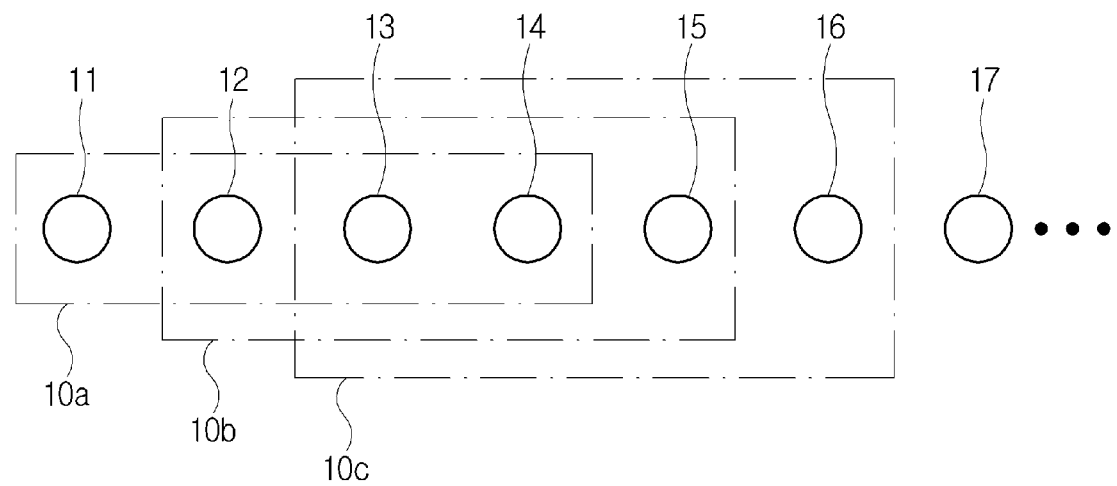

[FIG. 3]
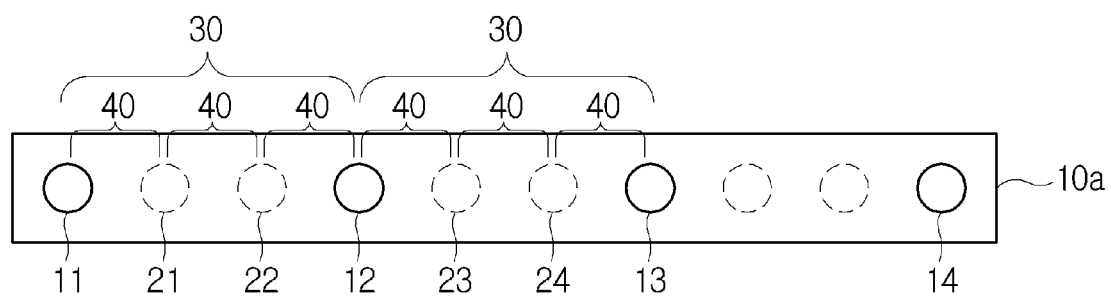

[FIG. 4]
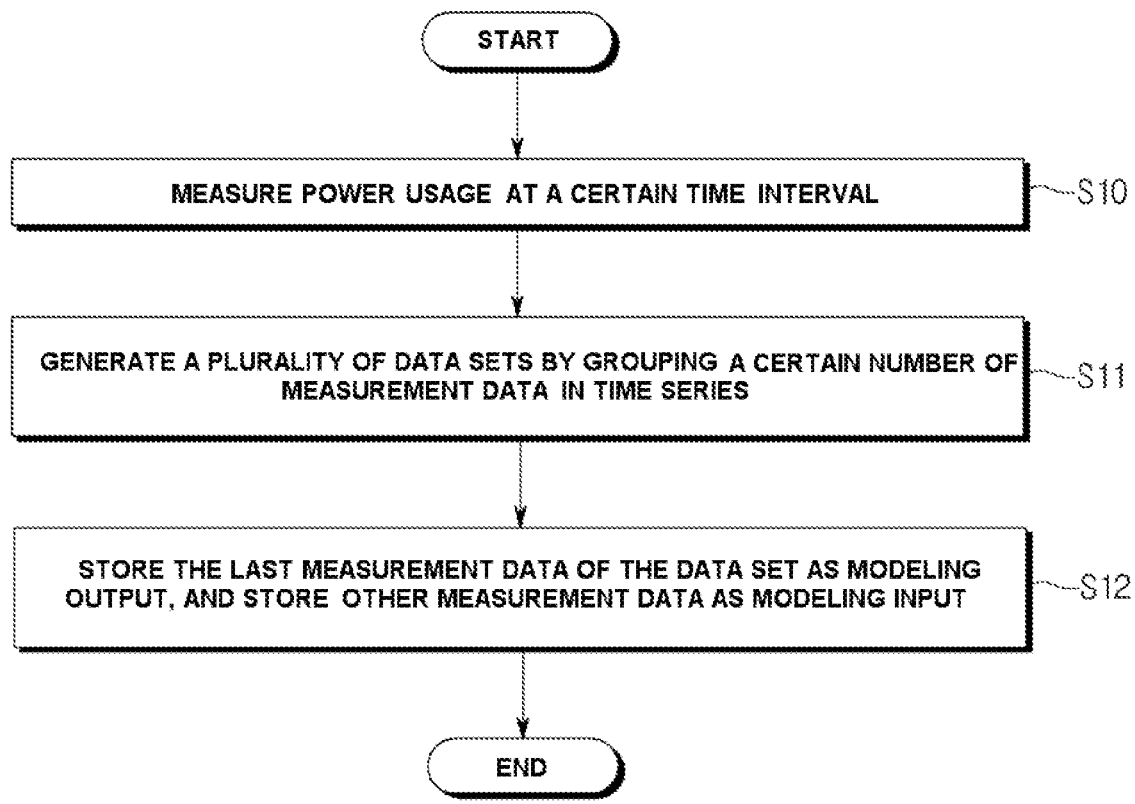

[FIG. 5]
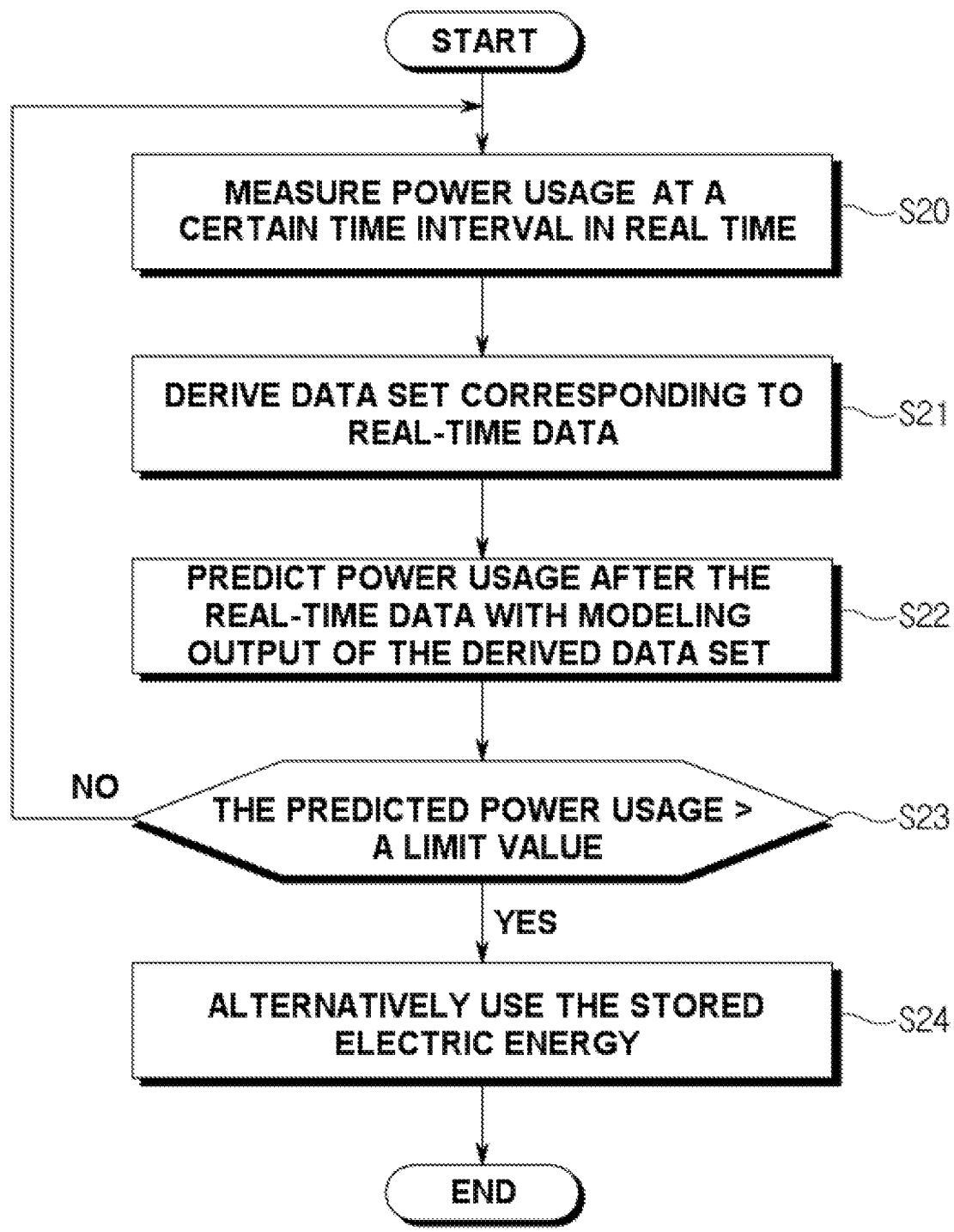

POWER USAGE PREDICTION SYSTEM AND METHOD

CROSS-REFERENCE TO RELATED APPLICATIONS

This application claims priority to Korean Patent Application No. 10-2017-0174257, filed on Dec. 18, 2017, the disclosure of which is incorporated herein by reference in its entirety.

BACKGROUND OF THE DISCLOSURE

Field of the Disclosure

The present disclosure relates to a power usage prediction system and method, and more particularly, to a power usage prediction system and method for predicting power usage using modeling data for power usage, and determining whether or not the predicted power usage reaches a limit value.

Description of the Related Art

A contemporary electricity billing system is based on calculating the basic rate based on the peak value for each fifteen minutes. That is, the basic rate is determined by the fifteen-minute period experiencing the highest power consumption in a given year. Generally, even if the power management is good, the basic rate will become remarkably expensive when the peak is mistakenly managed even for only fifteen minutes a year. In addition, the peak power can cause a serious problem in that electricity supply disruption occurs. Accordingly, the management of the peak power is very important.

In order to solve this problem, conventionally, the power usage was measured at a certain time interval, and an expert had to directly analyze the measured result to determine whether or not the power usage exceeds the peak.

SUMMARY OF THE DISCLOSURE

The present disclosure is intended to solve the problem, and an object of the present disclosure is to provide a power usage prediction system and method, which determines whether or not a predicted power usage exceeds a limit value using modeling data for power usage.

Another object of the present disclosure is to provide a power usage prediction system and method, which can enhance the accuracy of power usage prediction and predict power usage even without using a separate variable.

Other than the above-described objects of the present disclosure, other features and advantages of the present disclosure will be described hereinafter, or can be clearly understood by those skilled in the art to which the present disclosure pertains from the technology and the descriptions thereof.

A power usage prediction system in accordance with an embodiment of the present disclosure for achieving the objects may include a power measurement unit for measuring power usage at a certain time interval; a modeling unit for generating a plurality of data sets by grouping a certain number of a plurality of measurement data indicating the measured power usage in time series, storing the last measurement data of the data set as a modeling output, and storing measurement data other than the modeling output of the data set as a modeling input; and a prediction unit for inputting real-time data measured in real time in the power measurement unit into the modeling unit in time series, and predicting the power usage after the real-time data by corresponding the real-time data with the plurality of data sets.

A power usage prediction method in accordance with an embodiment of the present disclosure for achieving the objects may include generating a plurality of data sets by grouping a certain number of measurement data indicating measured power usage at a certain time interval in time series, storing the last measurement data of the data set as a modeling output, and storing measurement data other than the modeling output of the data set as a modeling input; and predicting the power usage after real-time data through the data set corresponding to the real-time data indicating the measured power usage in real time.

The power usage prediction system and method in accordance with the embodiment of the present disclosure can predict the power usage with high accuracy using the modeling module for power usage.

In addition, it is possible to enhance the accuracy of power usage prediction and to model it without using a separate variable, thus predicting power usage without expert help.

In addition, other features and advantages of the present disclosure can be also newly recognized through the embodiments of the present disclosure.

BRIEF DESCRIPTION OF THE DRAWINGS

FIG. 1 is a block diagram of a power usage prediction system in accordance with an embodiment of the present disclosure.

FIG. 2 is a diagram illustrating a configuration of a data set in accordance with the embodiment of the present disclosure.

FIG. 3 is a diagram illustrating a modeling input and a sub-modeling input in accordance with the embodiment of the present disclosure.

FIG. 4 is a flowchart of a method of generating the data set of FIG. 2 in accordance with the embodiment of the present disclosure.

FIG. 5 is a flowchart of a power usage prediction method in accordance with the embodiment of the present disclosure.

DESCRIPTION OF SPECIFIC EMBODIMENTS

Hereinafter, exemplary embodiments of the present disclosure will be described in detail with reference to the accompanying drawings so that those skilled in the art can easily practice the present disclosure. The present disclosure can be implemented in various different forms, and is not limited to the exemplary embodiments described herein.

In order to clearly illustrate the present disclosure, parts not related to the description are omitted, and like parts are denoted by similar reference numerals throughout the specification.

Throughout this specification, it will be understood that when an element is referred to as being "connected" to another element, it can be "directly connected" to the other element or "electrically connected" to the other element with other elements interposed therebetween. It will be further understood that when an element is referred to as "comprises" another element, the element is intended not to exclude other elements, but to further include other elements, unless the context clearly indicates otherwise.

When it is described that any one part is "on" the other part, it can mean that the part is directly on the other part or any other part is interposed therebetween. On the contrary, when it is described that any one part is "directly on" the other part, there is no other part interposed therebetween.

The terms "first," "second," "third" and the like are used to illustrate different parts, components, areas, layers and/or sections, but are not limited thereto. The terms are only used to differentiate a certain part, component, area, layer or section from other part, component, area, layer or section. Accordingly, a first part, component, area, layer or section, which will be mentioned hereinafter, can be referred to as a second part, component, area, layer or section without departing from the scope of the present disclosure.

The terminology used herein is for the purpose of describing particular embodiments only and is not intended to limit the present disclosure. As used here, the singular forms are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, and/or components.

Terms "below", "above", and the like indicating a relative space can be used to more easily describe a relationship between one part illustrated in the drawings with another part. These terms are intended to include other meanings or operations of a device that is being used, in addition to meanings intended in the drawings. For example, when the device in the drawing is inverted, any parts described as being "below" other parts can be described as being "above" the other parts. Therefore, the exemplary term "below" includes both of an upper direction and a lower direction. The device can rotate by 90° or other angles, and the terms indicating a relative space are also interpreted according thereto.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be additionally interpreted as having a meaning that is consistent with their meaning in the context of the relevant art and/or the present disclosure, and will not be interpreted in an idealized or overly formal sense unless expressly so defined herein.

Hereinafter, exemplary embodiments of the present disclosure will be described in detail with reference to the accompanying drawings so that those skilled in the art can easily practice the present disclosure. However, the present disclosure can be implemented in various different forms, and is not limited to the exemplary embodiments described herein.

FIG. 1 illustrates a configuration of a power usage prediction system 100 in accordance with an embodiment of the present disclosure.

Referring to FIG. 1, the power usage prediction system 100 may include a power measurement unit 110, a modeling unit 120, and a prediction unit 130.

The power measurement unit 110 can measure power usage at a certain time interval. The power measurement unit 110 is not limited to measuring the power usage at the certain time interval, and can measure the power usage for a certain time to output an average value, or measure the power usage for a certain time to output the highest power usage. The power measurement unit 110 can measure the power individually used in each of a plurality of loads (e.g., consumer sites), and can measure the total power used in a number of loads collectively (e.g., over a certain coverage area). The power measurement unit 110 can deliver the measured power usage to the modeling unit 120 and the prediction unit 130.

The modeling unit 120 can generate a plurality of data sets by grouping a certain number of a plurality of measurement data indicating measured power usage in time series, store the last measurement data of the data set as a modeling output, and store other measurement data other than the modeling output of the data set as a modeling input.

Specifically, when the power measurement unit 110 measures the power usage every ten minutes, the modeling unit 120 can list the measurement data at ten minutes, the measurement data at twenty minutes, the measurement data at thirty minutes, the measurement data at forty minutes, etc. in time series, and generate a data set by grouping a certain number of them. That is, the modeling unit 120 can constitute as one data set the measurement data at ten minutes, the measurement data at twenty minutes, the measurement data at thirty minutes, and the measurement data at forty minutes. The modeling unit 120 can store as a modeling output the last measurement data among the measurement data listed in time series in the data set, and store other measurement data other than the modeling output as a modeling input. That is, the modeling unit 120 can store the measurement data at ten minutes, the measurement data at twenty minutes, and the measurement data at thirty minutes as a modeling input, and store the measurement data at forty minutes as a modeling output.

In addition, the modeling unit 120 can be configured so that some measurement data between at least one data set of a plurality of data sets and other data sets of the plurality of data sets overlap each other. Specifically, when the power measurement unit 110 measures the power usage every ten minutes, the modeling unit 120 can generate the data set by grouping a certain number of the plurality of measurement data of the measurement data at ten minutes, the measurement data at twenty minutes, the measurement data at thirty minutes, the measurement data at forty minutes. That is, the modeling unit 120 can constitute as one data set the measurement data at ten minutes, the measurement data at twenty minutes, the measurement data at thirty minutes, and the measurement data at forty minutes. In addition, the modeling unit 120 can constitute as one data set the measurement data at twenty minutes, the measurement data at thirty minutes, the measurement data at forty minutes, and the measurement data at fifty minutes. In this time, the modeling unit 120 can store a plurality of generated data sets in time series.

Here, there can be a certain time interval between the pluralities of data sets. That is, there can have a certain time interval between the data set composed of the measurement data at ten minutes, the measurement data at twenty minutes, the measurement data at thirty minutes, and the measurement data at forty minutes and the data set composed of the measurement data at twenty minutes, the measurement data at thirty minutes, the measurement data at forty minutes, and the measurement data at fifty minutes.

In addition, the modeling unit 120 can derive a sub-modeling input based on the additional measurement data between the modeling inputs constituting the data set. Here, the sub-modeling input can include data for power usage measured at the times between the modeling inputs. Specifically, the power measurement unit 110 can additionally measure measurement data at the time between the measurement data, and the modeling unit 120 can store the additionally measured measurement data as a sub-modeling input. For example, the power measurement unit 110 can additionally measure the power usage at fifteen minutes, which is between the measurement data at ten minutes and the measurement data at twenty minutes. In this time, the modeling unit 120 can store the measurement data at fifteen minutes in the data set composed of the measurement data at ten minutes and the measurement data at twenty minutes. That is, the modeling unit 120 can construct as one data set the measurement data at ten minutes—the measurement data at fifteen minutes—the measurement data at twenty minutes, and store the measurement data at ten minutes and the measurement data at twenty minutes as a modeling input and the measurement data at fifteen minutes as a sub-modeling input. At least one sub-modeling input can be present between the modeling inputs that are close in time series, and the modeling unit 120 can adjust the time interval of the modeling for power usage depending upon the number of the derived modeling inputs.

The prediction unit 130 inputs the real-time data measured in real time in the power measurement unit 110 to the modeling unit 120 in time series, and predicts the power usage after the real-time data by corresponding the real-time data with the plurality of data sets.

Specifically, the power measurement unit 110 measures the power usage at a certain time interval in real time, and the prediction unit 130 inputs the real-time data measured in the power measurement unit 110 to the modeling unit 120 in time series. The prediction unit 130 can derive the data set having the modeling input corresponding to the real-time data among the data sets stored in the modeling unit 120. The prediction unit 130 can predict the power usage after the real-time data using the modeling output of the derived data set. That is, the measurement data configured in the data set are listed in time series and the modeling output is the last measurement data of the data set, such that the prediction unit 130 can predict that the same power usage as the modeling output will be measured after the real-time data when the same real-time data as the modeling input that is the data of the previous time of the modeling output is measured.

In addition, the prediction unit 130 can predict the power usage through the modeling output of the data set corresponding to the real-time data and the sub-real-time data measured in real time. Here, the sub-real-time data can include data for the power usage measured at the times between the real-time data that are close in time series. The sub-real-time data can be measured in the power measurement unit 110. For example, the power measurement unit 110 can additionally measure the power usage at fifteen minutes that is between the real-time data at ten minutes and the real-time data at twenty minutes. In this time, the prediction unit 130 can input the real-time data at ten minutes—the sub-real-time data at fifteen minutes—the real-time data at twenty minutes to the modeling unit 120 in time series. The prediction unit 130 can derive a data set having the modeling input corresponding to the real-time data at ten minutes and the real-time data at twenty minutes, and compare the sub-real-time data at fifteen minutes with the derived sub-modeling input of the modeling set. That is, the prediction unit 130 can compare the sub-real-time data at fifteen minutes with the sub-modeling input between the two time-series modeling inputs corresponding to the real-time data at ten minutes and the real-time data at twenty minutes. Here, the sub-modeling input and the sub-real-time data are used to more accurately predict the power usage, and need not always be the same. The prediction unit 130 can more accurately predict the power usage by reflecting the difference between the sub-modeling input and the sub-real-time data.

The prediction unit 130 can determine whether or not the predicted power usage exceeds a predetermined limit value. There is a predetermined limit value for power usage, and when the power usage exceeds the limit value, the charge for power usage will increase sharply or a fine can be levied. Accordingly, the prediction unit 130 can determine whether or not the predicted power usage exceeds the predetermined limit value, and when it is determined that the power usage exceeds the predetermined limit value, it can generate a response accordingly. When it is determined that the power usage exceeds the predetermined limit value, possible counter-measures may include cutting off the power source of the specific load using the power and for the end user (load) to alternatively use the electric energy stored in an energy storage device (not illustrated). Here, the energy storage device can store electric energy that is generated by or developed from a renewable energy source such as solar heat, solar power generation, biomes, wind power, small hydro power, geothermal energy, marine energy, and waste energy, or a new renewable energy source such as fuel cells, coal liquefied gasification, and hydrogen energy.

FIG. 2 illustrates a configuration of the data set in accordance with the embodiment of the present disclosure.

Referring to FIGS. 1 and 2, the power measurement unit 110 can measure power usage at a certain time interval. The modeling unit 120 can generate a plurality of data sets 10a, 10b, and 10c by grouping a certain number of a plurality of measurement data 11, 12, 13, 14, 15, 16, 17 indicating the measured power usage in time series.

Specifically, the modeling unit 120 can generate a first data set 10a by grouping a certain number of the measurement data 11, 12, 13, 14. In this time, the modeling unit 120 can store the last measurement data 14 in time series as a modeling output, and can store other measurement data 11, 12, and 13 (excluding the modeling output) as a modeling input. Here, when the real-time data measured in real time by the power measurement unit 110 corresponds to the measurement data 11, 12, 13, the prediction unit 130 can predict the power usage after the real-time data based on the measurement data 14 that is the modeling output.

In addition, the modeling unit 120 can exclude the fastest measurement data 11 in time series in the first data set 10a, and include the measurement data 15 immediately after the last measurement data 14 in time series in the first data set 10a to generate a new data set. That is, the modeling unit 120 can generate a second data set 10b by grouping a certain number of the measurement data 12, 13, 14, 15. In this time, the modeling unit 120 can store the last measurement data 15 in time series as a modeling output, and can store other measurement data 12, 13, 14 other than the modeling output as a modeling input. Here, when the real-time data measured in real time by the power measurement unit 110 corresponds to the measurement data 12, 13, 14, the prediction unit 130 can predict the power usage after real-time data based on the measurement data 15 that is the modeling output.

In addition, the modeling unit 120 can exclude the fastest measurement data 12 in time series in the second data set 10b, and include the measurement data 16 immediately after the last measurement data 15 in time series in the second data set 10b to generate a new data set. That is, the modeling unit 120 can generate a third data set 10c by grouping a certain number of the measurement data 13, 14, 15, 16. In this time, the modeling unit 120 can store the last measurement data 16 in time series as a modeling output, and can store other measurement data 13, 14, 15 other than the modeling output as a modeling input. The modeling unit 120 can generate a plurality of data sets to more accurately predict the power usage.

FIG. 3 illustrates modeling inputs and sub-modeling inputs in accordance with the embodiment of the present disclosure.

Referring to FIGS. 1 and 3, the modeling unit 120 can derive the sub-modeling input including data for power usage measured at the times between the modeling inputs through additional measurement data between the modeling inputs constituting the data set.

Specifically, the power measurement unit 110 can additionally measure the power usage at the time between the measurement data 11 and the measurement data 12, and the modeling unit 120 can store the measurement data additionally measured to the sub-modeling inputs 21, 22. In this time, the time interval between the sub-modeling inputs 21, 22 40 is the same, and the number of sub-modeling inputs is not limited to two and can be at least one. Here, the time interval between the sub-modeling inputs 40 can be a time interval shorter than the time interval between the modeling inputs 30, and the time interval between the fastest sub-modeling input 21 in time series among the sub-modeling inputs and the modeling input 11 that is the closest to the fastest sub-modeling input 21 in time series can be the same as the time interval between the sub-modeling inputs 40. In addition, the time interval between the last sub-modeling input 22 in time series among the sub-modeling inputs and the modeling input 12 that is the closest to the last sub-modeling input 22 in time series can be the same as the time interval between the sub-modeling inputs 40.

In addition, the modeling unit 120 can store the measurement data additionally measured in the power measurement unit 110 as sub-modeling inputs 23, 24. In this time, the time interval between the sub-modeling inputs 23, 24 40 is the same, and the time interval between the sub-modeling inputs 40 can be shorter than the time interval between the modeling inputs 30. In addition, the time interval between the fastest sub-modeling input 23 in time series among the sub-modeling inputs and the modeling input 12 that is the closet to the fastest sub-modeling input 23 in time series can be the same as the time interval between the sub-modeling inputs 40. In addition, the time interval between the last sub-modeling input 24 in time series among the sub-modeling inputs and the modeling input 13 that is the closet to the last sub-modeling input 24 in time series can be the same as the time interval between the sub-modeling inputs 40. The prediction unit 130 can more accurately predict the power usage after the real-time data using the sub-modeling input.

FIG. 4 illustrates a data set generation method in accordance with the embodiment of the present disclosure.

Referring to FIGS. 1 and 4, the power measurement unit 110 can measure the power usage at a certain time interval S10. The power measurement unit 110 can measure the power usage at the certain time interval, and can additionally measure the measurement data at the time between the measurement data indicating the measured power usage. Here, the measurement data additionally measured can be plural.

The modeling unit 120 can generate a plurality of data sets by grouping a certain number of the measurement data in time series S11. The modeling unit 120 can list the measurement data measured by the power measurement unit 110 in time series, and group a certain number of them to generate a data set. In addition, the modeling unit 120 can exclude the fastest measurement data in time series in the generated data set, and can include the measurement data immediately after the last measurement data in time series in the generated data set to generate a new data set. In this time, the modeling unit 120 can include the measurement data additionally measured at the time between the measurement data to generate a data set. The plurality of data sets can be generated, and the modeling unit 120 can store the data set in time series.

The modeling unit 120 can store the last measurement data of the data set as a modeling output, and store the other measurement data as a modeling input S12. The modeling unit 120 can store the last measurement data among the measurement data listed in time series in the data set as a modeling output, and store other measurement data other than the modeling output as a modeling input. In this time, the modeling unit 120 can store the measurement data additionally measured at the time between the measurement data as a sub-modeling input.

FIG. 5 illustrates a power usage prediction method in accordance with the embodiment of the present disclosure.

Referring to FIGS. 1 and 5, the power measurement unit 110 can measure the power usage at a certain time interval in real time S20. The power measurement unit 110 can measure the power usage at a certain time interval, and can additionally measure real-time data at the time between the real-time data indicating the measured power usage. Here, the real-time data additionally measured can be plural.

The prediction unit 130 can derive a data set corresponding to real-time data measured in real time in the power measurement unit 110 S21. The prediction unit 130 can derive a data set having a modeling input corresponding to the real-time data among the data sets stored in the modeling unit 120. In this time, the prediction unit 130 can derive the more accurate data set by comparing the real-time data additionally measured at the time between the real-time data with the sub-modeling input.

The prediction unit 130 can predict the power usage after real-time data with the modeling output of the derived data set S22. The prediction unit 130 can predict the power usage after the real-time data using the modeling output that is the last measurement data in time series of the derived data set. That is, the measurement data configured in the data set are listed in time series, and the modeling output is the last measurement data of the data set, such that the prediction unit 130 can predict that the same power usage as the modeling output will be measured after the real-time data when the same real-time data as the modeling input that is the data of the previous time of the modeling output is measured.

It is possible to determine whether or not the power usage predicted in the prediction unit 130 exceeds a limit value S23. When the power usage exceeds the predetermined limit value, the charge for power usage can increase sharply or a fine can be levied. Accordingly, the prediction unit 130 can determine whether or not the predicted power usage exceeds the predetermined limit value.

When the power usage predicted in the prediction unit 130 exceeds the limit value, the stored energy can be alternatively used S24. It is possible to use the stored electric energy, thus preventing the power usage from exceeding the limit value. Here, when the power usage exceeds the limit value, it is not limited to the use of the stored energy, and the power source of the load using the power can be also cut off.

As described above, according to the embodiment of the present disclosure, it is possible to realize the power usage prediction system and method, which predicts the power usage using the modeling data for power usage and determines whether or not the predicted power usage reaches the limit value.

Those skilled in the art to which the present disclosure pertains will understand that the present disclosure can be implemented in other various forms without departing from the technical spirit or essential characteristics of the present disclosure, so the aforementioned embodiments should not be construed as being limitative. The scope of the present disclosure is disclosed in the following claims rather than the detailed description, and it should be understood that all modifications or variations derived from the meanings and scope of the appended claims and equivalents thereof.

What is claimed is:

1. A power usage prediction system, comprising:
a power measurement circuitry configured to measure power usage at a certain time interval;
a modeling circuitry configured generate a plurality of data sets by grouping a certain number of a plurality of measurement data indicating the measured power usage in time series, to store the last measurement data of the data set as a modeling output, and to store measurement data other than the modeling output of the data set as a modeling input; and
a prediction unit configured to input real-time data measured in real time in the power measurement circuitry into the modeling circuitry in time series, and to predict the power usage after the real-time data by corresponding the real-time data with the plurality of data sets,
wherein the modeling circuitry is configured to derive a sub-modeling input on additional measurement data between the model inputs constituting the data set, the derived sub-modeling input comprising data for the power usage measured at a specific time between the modeling inputs.

2. The power usage prediction system of claim 1, wherein some measurement data between at least one data set of the plurality of data sets and other data sets of the plurality of data sets overlap each other.

3. The power usage prediction system of claim 1,
wherein the modeling circuitry is configured to store the plurality of data sets in time series, and
wherein the prediction circuitry is configured to derive a data set having the modeling input corresponding to the real-data of the plurality of data sets, and to predict the power usage using the modeling output of the derived data set.

4. The power usage prediction system of claim 1, wherein there has a certain time interval between the plurality of data sets.

5. The power usage prediction system of claim 1,
wherein at least one sub-modeling input is present between the modeling inputs that are close in time series, and
wherein the modeling circuitry is configured to adjust a time interval of the modeling for the power usage depending upon the number of the derived sub-modeling inputs.

6. The power usage prediction system of claim 5,
wherein the power measurement circuitry is configured to measure sub-real-time data at the time between the real-time data that are close in time series, and wherein the prediction circuitry is configured to predict the power usage through the modeling output of the data set corresponding to the real-time data and the sub-real-time data.

7. The power usage prediction system of claim 1,
wherein the prediction circuitry is configured to determine whether or not the predicted power usage exceeds a predetermined limit value.

8. The power usage prediction system of claim 1, further comprising an energy storage configured to store electric energy,
wherein when it is determined that the power usage predicted in the prediction circuitry exceeds a predetermined limit value, the electric energy stored in the energy storage is alternatively used.

9. A power usage prediction method, comprising:
measuring, by a power measurement circuitry, power usage at a certain time interval;
generating by a modeling circuitry, a plurality of data sets by grouping a certain number of measurement data indicating measured power usage at a certain time interval in time series, storing the last measurement data of the data set as a modeling output, and storing measurement data other than the modeling output of the data set as a modeling input; and
predicting, by a prediction circuitry, the power usage after real-time data through the data set corresponding to the real-time data indicating the measured power usage in real time,
wherein the storing as the model input comprises deriving a sub-modeling input including data for the power usage measured at the times between the modeling inputs based on additional measurement data between the modeling inputs constituting the data set.

10. The power usage prediction method of claim 9,
wherein the generated plurality of data sets are stored in time series, and
wherein the power usage is predicted by deriving a data set having the modeling input corresponding to the real-time data of the plurality of data sets, and using the modeling output of the derived data set.

11. The power usage prediction method of claim 10,
wherein the storing as the modeling input measures a sub-real-time data at the time between the real-time data that are close in time series, and
wherein a prediction unit predicts the power usage through the modeling output of the data set corresponding to the real-time data and the sub-real-time data.

12. The power usage prediction method of claim 10, further comprising determining whether or not the predicted power usage exceeds a predetermined limit value.

13. The power usage prediction system of claim 6, wherein the prediction circuitry is configured to predict the power usage through the modeling output of the data set corresponding to the sub-modeling input and the sub-real-time data.

14. The power usage prediction system of claim 1, wherein a time interval between the sub-modeling inputs is same, and the time interval between the sub-modeling inputs is shorter than a time interval between the modeling inputs.

15. The power usage prediction system of claim 14, wherein a time interval between the fastest sub-modeling input in time series among the sub-modeling inputs and the modeling input that is the closest to the fastest sub-modeling input in time series is the same as the time interval between the sub-modeling inputs.

16. The power usage prediction system of claim 14, wherein a time interval between the last sub-modeling input in time series among the sub-modeling inputs and the modeling input that is the closest to the last sub-modeling input in time series is the same as the time interval between the sub-modeling inputs.

\* \* \* \* \*